US009453865B2

United States Patent
Jimenez et al.

(10) Patent No.: US 9,453,865 B2
(45) Date of Patent: *Sep. 27, 2016

(54) METHOD FOR SECURING A WIRELESS DEVICE FOR RF TESTING

(71) Applicant: ATC Logistics & Electronics, Inc., Fort Worth, TX (US)

(72) Inventors: Carlos Valmonte Jimenez, Keller, TX (US); Jimmee Paul Partee, Double Oak, TX (US); Fredrick Oluoch Onyango, Keller, TX (US)

(73) Assignee: ATC Logistics & Electronics, Inc., Fort Worth, TX (US)

( * ) Notice: Subject to any disclaimer, the term of this patent is extended or adjusted under 35 U.S.C. 154(b) by 203 days.

This patent is subject to a terminal disclaimer.

(21) Appl. No.: 14/070,248

(22) Filed: Nov. 1, 2013

(65) Prior Publication Data

US 2014/0071001 A1 Mar. 13, 2014

Related U.S. Application Data

(62) Division of application No. 12/613,324, filed on Nov. 5, 2009, now Pat. No. 8,810,460.

(51) Int. Cl.
*G01R 29/10* (2006.01)
*G01R 29/08* (2006.01)

(52) U.S. Cl.
CPC ............ *G01R 29/10* (2013.01); *G01R 29/0821* (2013.01)

(58) Field of Classification Search
CPC .................. G01R 29/10; G01R 29/0821
See application file for complete search history.

(56) References Cited

U.S. PATENT DOCUMENTS

| 5,214,374 | A | 5/1993 | St. Onge |
| 5,300,879 | A | 4/1994 | Masuda et al. |
| 5,300,881 | A | 4/1994 | Ferrer et al. |
| 5,844,414 | A * | 12/1998 | Eriksson ............ G01R 1/06705 324/627 |
| 6,021,315 | A | 2/2000 | Telewski |
| 6,025,729 | A | 2/2000 | Van Loan et al. |
| 6,249,248 | B1 | 6/2001 | Kitayoshi |
| 7,081,869 | B2 | 7/2006 | Sommerfeld et al. |
| 7,102,517 | B2 | 9/2006 | Reyes et al. |
| 7,165,003 | B2 | 1/2007 | Mok |
| 7,268,564 | B2 | 9/2007 | Ozaki et al. |
| 7,285,972 | B2 | 10/2007 | Sommerfeld et al. |
| 7,876,276 | B1 | 1/2011 | Zaman et al. |

(Continued)

FOREIGN PATENT DOCUMENTS

EP 1512980 A2 3/2005
JP H0526930 A 2/1993

OTHER PUBLICATIONS

International Search Report and Written Opinion date mailed Jan. 6, 2011 for PCT Application No. PCT/US2010/055438.

*Primary Examiner* — Robert Karacsony
(74) *Attorney, Agent, or Firm* — McGuire Woods LLP

(57) ABSTRACT

A system and method for testing RF characteristics of a wireless device. The wireless device is positioned in an x-position and a y-position of a horizontal plane of a test fixture. An RF antenna coupler is positioned in an x-position and a y-position of a vertical plane. The positioning of the wireless device and the RF antenna coupler correspond to acceptable RF characteristics for testing the wireless device. Positions of the wireless device and the RF antenna coupler are identified. The identified positions are utilized to perform subsequent testing of similar wireless devices.

21 Claims, 8 Drawing Sheets

(56) References Cited

U.S. PATENT DOCUMENTS

2006/0194553 A1 8/2006 Ozaki et al.
2008/0129614 A1* 6/2008 Raimann ................ H01Q 1/241
                                                                343/703

* cited by examiner

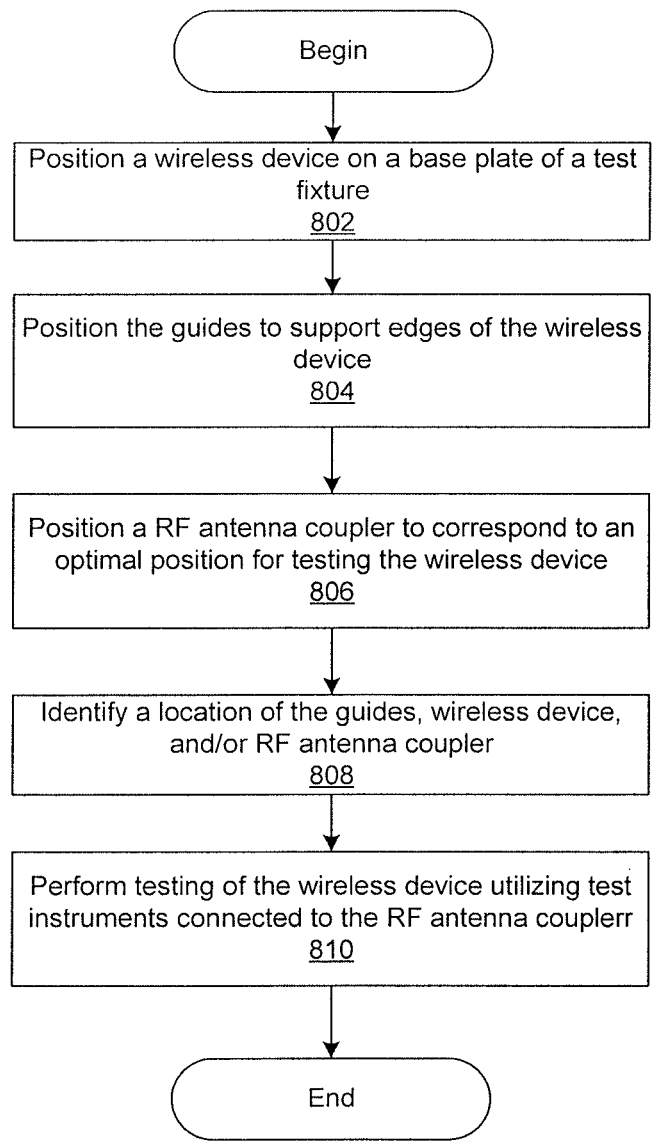

METHOD FOR SECURING A WIRELESS DEVICE FOR RF TESTING

CROSS REFERENCE TO RELATED APPLICATIONS

This application is a Divisional of U.S. patent application Ser. No. 12/613,324 filed on Nov. 5, 2009 entitled MULTI-DIMENSIONAL RF TEST FIXTURE AND METHOD FOR SECURING A WIRELESS DEVICE FOR RF TESTING the entire teachings of which are incorporated herein.

BACKGROUND

The use of and development of communications has grown nearly exponentially in recent years. The growth is fueled by larger networks with more reliable protocols and better communications hardware available to both service providers and consumers. In particular, new wireless devices, such as wireless handsets, personal digital assistants (PDAs), netbooks, laptops, wireless cards, and other similar elements are being released nearly constantly.

Wireless devices are required to go through various forms of testing to ensure compliance with communications standards, and technical requirements set by standard setting organizations (SSOs), governments, industry groups, a company, service providers, or other applicable parties. For example, the Federal Communications Commission (FCC) regulates the radio frequency (RF) energy that may be emitted by a cell phone. Performing tests for a wireless device or wireless device model may be time consuming and difficult because of different antenna pattern radiation, antenna positioning within each wireless device, and the necessity of repeating testing for multiple wireless devices.

SUMMARY

One embodiment provides a system and method for testing RF characteristics of a wireless device. The wireless device may be positioned in an x-position and a y-position of a horizontal plane of a test fixture. An RF antenna coupler may be positioned in an x-position and a y-position of a vertical plane. The positioning of the wireless device and the RF antenna coupler may correspond to acceptable RF characteristics for testing the wireless device. Positions of the wireless device and the RF antenna coupler may be identified. The identified positions may be utilized to perform subsequent testing of similar wireless devices.

Another embodiment provides a system and method for testing RF characteristics of a wireless device. The wireless device may be positioned on a base plate of a test fixture. An RF antenna coupler may be positioned above the wireless device. Positions of the wireless device and the RF antenna coupler may be identified. The identified positions may be utilized to perform subsequent testing of similar wireless devices.

Yet another embodiment provides a system and method for testing wireless characteristics of a wireless device. The wireless device may be received on a base plate of a test fixture. An RF antenna coupler may be secured above the wireless device. Positions of the wireless device and the RF antenna coupler may be indicated. The indicated positions may be utilized to perform subsequent testing of similar wireless devices.

BRIEF DESCRIPTION OF THE DRAWINGS

Illustrative embodiments of the present invention are described in detail below with reference to the attached drawing figures, which are incorporated by reference herein and wherein:

FIG. 8 is a flowchart of a process for performing RF testing utilizing the test fixture in accordance with an illustrative embodiment.

DETAILED DESCRIPTION OF THE DRAWINGS

Figure 1:
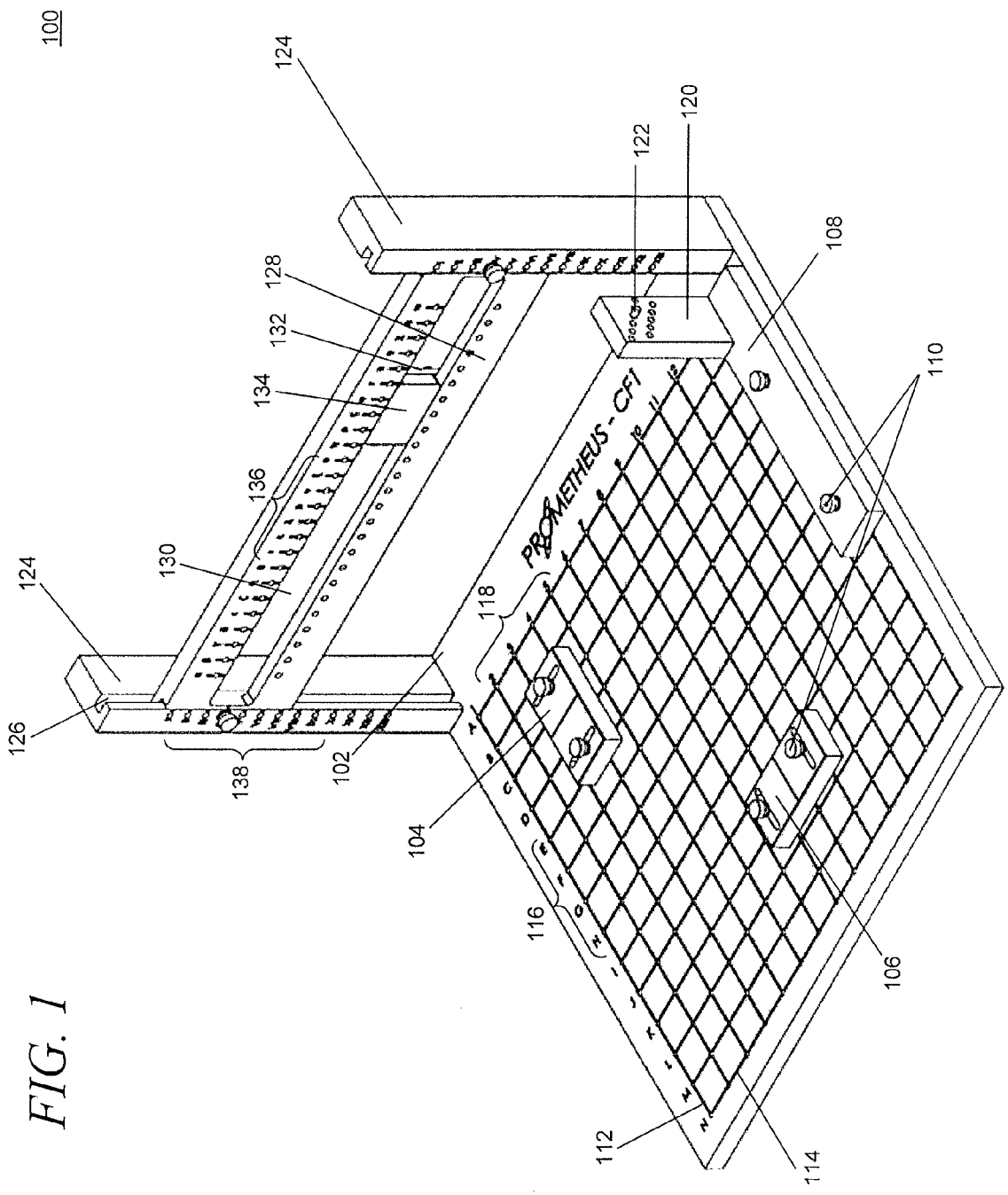
FIG. 1 is a pictorial representation of a test fixture in accordance with an illustrative embodiment.

Illustrative embodiments provide a test fixture and method for performing RF testing of wireless devices. The wireless device is any device or apparatus configured for wireless communications. The wireless devices may include cell phones, PDAs, BlackBerry® devices, communications-enabled MP3 players, EVDO cards, wireless cards, netbooks, laptops, tablets, e-book readers, global positioning systems (GPS), or other computing or telecommunications devices configured for wireless communication.

In one embodiment, a test fixture may be utilized to secure the wireless device while testing and measuring the RF characteristics and performance of the wireless device for transmitting and receiving wireless communications. The test fixture may position the wireless device and one or more RF antenna couplers in the ideal or optimal relative positions to achieve acceptable RF characteristics for testing. The acceptable RF characteristics are optimal measurements as manually or automatically determined for the wireless device based on test parameters, requirements, wireless device, and testing system. For example, the acceptable RF characteristics may be selected by a test engineer based on the best available information. The RF characteristics that are most frequently tested may include transmitter, modulation, spectrum, and receiver measurements. Transmitter measurements may evaluate the RF output power of the wireless device, these may include: maximum output transmit power and minimum output power. Modulation measurements may compare the actual modulation vector with the ideal reference vector, these may include: error vector magnitude, phase error, frequency error, magnitude error, and waveform quality. Spectrum measurements may measure the amount of energy that falls outside the carrier frequency, these may include: adjacent channel power and adjacent channel leakage power ratio. Receiver measurements may compare the output signal sent by the RF test instrument with the signal received by the wireless device, these may include: bit error rate, frame erasure rate, and block error ratio.

The wireless devices may utilize any number of wireless communications standards, protocols, or formats along with associated hardware, software, and firmware including wideband code division multiple access (W-CDMA), CDMA, global system for mobile communications (GSM), general packet radio service (GPRS), enhanced GPRS (EGPRS), high-speed downlink packet access (HSDPA), evolution-data optimized (EVDO), WiFi, Bluetooth, GPS, WiMAX, personal communications service, analog, and wireless local area networks.

In particular, the test fixture may allow different model types to be repeatably tested. For example, the test fixture may be configured to test a set of fifty cell phones of a particular model. After the test fixture is initially configured, multiple wireless devices of that same model, configuration, or size and shape ("similar devices") may be tested utilizing the test fixture. The test fixture may indicate the positioning of the respective components utilized during testing to reconfigure the test fixture at a later time. The test fixture may allow a user to position an RF antenna coupler relative to the communications elements of the wireless device for testing the RF characteristics of the wireless device. For example, RF testing of a laptop may require that the lid be positioned at a certain angle to ensure optimal wireless transmission characteristics for measurement by the RF antenna coupler. As a result, multiple tests for wireless devices may be carried out efficiently and consistently and with a high degree of accuracy for multiple wireless devices reducing costs, time, and difficulty.

The test fixture may be utilized by governmental entities, SSOs, companies, research and development groups, industry regulators, and others that test the RF characteristics of the wireless device. The test fixture may be configured without any special tools or expensive training. For example, nylon set screws may be utilized to position and secure the components of the test fixture. The test fixture provides a universal test stand, platform, or fixture that may be utilized for numerous wireless devices, reducing the equipment and lab costs that may be required to test each wireless device. The test fixture may allow testing for a wireless device to be repeated by multiple parties (OEM, service provider, government entity). In particular, being able to consistently reproduce RF testing may be important when important findings, such as compliance failures or communications failures are measured or tested. The RF testing may include communications to and from the wireless device.

FIG. 1 is a pictorial representation of a test fixture in accordance with an illustrative embodiment. FIG. 1 illustrates one embodiment of a test fixture 100. The test fixture 100 is a stand, platform, or tool configured to enable a user to perform RF testing and RF character analysis for a wireless device. RF testing may include measuring transmission strength, antenna sensitivity of the wireless device, signal quality, and other similar measurements.

In one embodiment, the test fixture 100 may include a base plate 102, a left guide 104, a front guide 106, a right guide 108, set screws 110, vertical gridlines 112, horizontal gridlines 114, y-indicators 116, x-indicators 118, a vertical support 120, a stop 122, vertical guides 124, grooves 126, a horizontal guide 128, a slot 130, a back plate 132, an RF antenna coupler 134, x-indicators 136, and y-indicators 138 (the "components").

Although not specifically described, the test fixture 100 may be mounted or placed in an RF isolation chamber, room, or box. The RF isolation box prevents radio frequency signals from reaching the wireless device, test fixture 100, and the RF antenna coupler 134 for preventing unwanted interference and ensuring the accuracy of RF testing. In another embodiment, the test fixture 100 may be utilized in a room insulated or shielded for performing RF testing. The wireless device and RF antenna coupler 134 may be connected to a test set, system, device(s), instrument, or other test equipment ("test instrument") which may include signal generators, recording devices, logical elements, and signal analyzers. In one example, the test instrument may be a Rohde & Schwarz CMU200, an Agilent 8960, or other similar test instruments. An RF cable (not shown) with the appropriate or selected insertion loss may connect the test instrument to an RF port of the wireless device. In another embodiment, an RF cable may be connected between the test instrument and the RF shielded chamber housing the test fixture 100. For example, the RF cable may connect to the RF antenna coupler 134.

Various parameters of the wireless device and/or test instrument may be varied depending on the applicable wireless standard and the tests being performed, including the RF power level for the test instrument for transmitting, the maximum transmit outer power limits for the test instrument for transmitting, the RF power level of the test instrument for receiving signals, the bit error rate (BER)/frame error rate (FER) limits, and RF channels including low, middle, and high channels for each band.

The base plate 102 is a support structure or framework for supporting or holding a portion of the wireless device. For example, the base plate 102 may support a bottom portion or keyboard of the wireless device. The base plate 102 may be a lattice, honeycomb, checkerboard, or other structure. The user may also position the wireless device face down on the base plate 102 based on the configuration of the wireless device and the testing requirements. For example, a keyboard of the wireless device may sit on the base plate 102. In the illustrative embodiments, the test fixture 100 is composed entirely of non-conducting or non-metallic elements in order to provide accurate RF testing results. Metal within any of the components of the test fixture 100 may adversely reflect or absorb RF signals generated by the wireless device or RF antenna coupler 134, thereby affecting the results of the testing. The base plate 102 and test fixture 100 may be of any size to accommodate large laptops, complexly shaped GPS devices, and the smallest cell phones.

The components that compose or are attached to the test fixture 100 may be molded, manufactured, or created from a single material or multiple materials. For example, the test fixture 100 may be composed entirely of plastic, composites, wood, rubber, nylon, or any number of materials that maximize or enhance the testing as performed for the wireless device positioned on the test fixture 100. In one embodiment, the test fixture is formed from acetal (such as Delrin manufactured by DuPont, a homopolymer acetal), a thermoplastic. Acetal and other similar thermoplastics have the ability to absorb electromagnetic energy maximizing the effectiveness of the RF testing. In one embodiment, the set screws 110 are made from nylon. The test fixture 100 and components may be generated utilizing a Computer Numerical Control (CNC) machine, molded from individual parts, or custom made utilizing hand tools.

In one embodiment, the wireless device is positioned on the base plate 102. The left guide 104, front guide 106, and right guide 108 (or hereinafter referred to as "guides") may be removable or may be slidably attached to the base plate 102. The guides are supports or stops that support the wireless device. In particular, the guides may secure the wireless device and prevent the wireless device from slipping or moving during testing.

The guides may physically secure the wireless device to the test fixture 100. The guides may include any number of shapes. In one embodiment, the guides are rectangularly shaped. In another embodiment, the guides are a flattened-oval shape with rounded edges and made of a rubber composite for abutting the wireless device. The guides may also be L-shaped, rounded, or semi-circular to accommodate a corner of the wireless device or other distinct shapes.

In another embodiment, the test fixture 100 may include a rear guide, which may similarly be positioned on the base plate 102. The base plate 102 is positioned or referenced in a horizontal plane. The x and y direction of the horizontal plane corresponds to the horizontal gridlines 114 and vertical gridlines 112 as well as the x-indicators 118 and the y-indicators 116, respectively. As a result, a wireless device being tested may be positioned in the x and y direction of the horizontal plane, as may the left guide 104, front guide 106 and right guide 108.

The set screws 110 may pass through holes or slots defined by the guides in order to entirely remove the guides from the base plate 102 and corresponding test fixture 100. In another embodiment, the set screws 110 may only be loosened (without disengaging the guides entirely), thereby allowing the guides to be moved or positioned on the base plate. In one embodiment, the guides may be moved along the vertical gridlines 112 and horizontal gridlines 114 to abut and support the wireless device on two or more sides to prevent movement in two directions. For example, the vertical gridlines 112 and horizontal gridlines 114 may be vertical and horizontal grooves, rails, through holes, markings, or protrusions used to attach the guides to the base plate utilizing connectors. For example, the vertical gridlines 112 and horizontal gridlines 114 may be sized to receive the set screws 110 or other connectors for securing the guides in place. Alternatively, the vertical gridlines 112 and horizontal gridlines 114 may be entirely cosmetic.

In one embodiment, the guides may include fitted extensions underneath configured to slidably move within the vertical gridlines 112 and horizontal gridlines 114. The set screws 110 are a specific example, but represent any number of attachment devices or connectors that may be utilized to fix the elements to the test fixture 100. In one embodiment, the set screws 110 are nylon screws that may be screwed into the vertical gridlines 112 and horizontal gridlines 114. The set screws 110 may also be utilized in conjunction with the vertical support 120, the vertical guides 124, the horizontal guide 128, and the back plate 132.

In another embodiment, the set screws 110 may be replaced by other connectors which may include clips, clamps, bolts, screws, nails, dowels, adhesives, pegs, Velcro, or other attachment elements that allow the different components of the test fixture 100 to be positioned and then secured or fixed for testing. The y-indicators 116 and the x-indicators 118 are visual indicators or markings indicating the position of the wireless device and the guides on the base plate 102. The v-indicators 116 and the x-indicators 118 may be included on the edges or across the entire base plate 102. The y-indicators 116 and the x-indicators 118 may represent information written, etched, inscribed, output, or otherwise displayed on the base plate 102 or on one or more guides. In another embodiment, the y-indicators 116 and the x-indicators 118 may include digital read-outs, screens, or electronic information.

In one embodiment, the x-indicators 118 may be numbers and the y-indicators 116 may be letters. The x-indicators 118 and the y-indicators 116 may provide sub-indicators or levels of granularity which may include English or metric units. For example, the x-indicators 118 may be numbers representing centimeters across the base plate 102 and may further include marks or indicators representing millimeters between each centimeter. The x-indicators 118 may be further labeled across the entirety of the base plate 102. Similarly, the y-indicators 116 may include additional levels of granularity. For example, the letters may similarly represent a centimeter or other larger measurement units and may include indicators, such as lines, markers, or the characters A-1, A-2, A-3, A-4, A-5, A-6, . . . A-N, or A.1, A.2, A.3, . . . A.N may indicate millimeters between each letter comprising the y-indicators 116. As a result, by analyzing or looking at the base plate 102 and markers or indicators of the test fixture 100, a user may be able to determine the exact location of the wireless device or components. Different markers or indicator sets or nomenclatures may be utilized for each component or measurement scale of the test fixture 100.

Determining the positions of the guides and the wireless device may be particularly important for reconfiguring the test fixture 100 for subsequent tests of a wireless device model. The x-indicators 118 and y-indicators 116 allow tests to be performed and repeated much more simply by indicating exact positioning of the components. For example, a service provider may utilize a testing configuration designed by the OEM to position the wireless device, size the air gap, and otherwise perform testing of the wireless device utilizing the test fixture. Disputes and miscommunication are minimized utilizing the universal fit of the test fixture 100 in conjunction with repeatable configurations for similar wireless devices.

In another embodiment, the guides may include digital or analog counters, indicators, or sensors that display or otherwise indicate the exact position or location of the guides or the wireless device. For example, the user may place each of the guides at a specific or default location on the base plate 102 before moving it to a testing position. The guides may mechanically or electronically measure the movement of the guides from one or more default (or zero) positions to the testing position. The counter may provide information indicating the exact location of each of the guides as well as the wireless device on the base plate 102. Notches or grooves within the vertical gridlines 112 and the horizontal gridlines 114 may increment or decrement a counter on each guide as moved. Similarly, the y-indicators 116 and x-indicators 118 may increase or decrease position or location information or a display that corresponds to each of the guides.

In another embodiment, the base plate 102 may include one or more sensors dispersed within or on a bottom portion of the base plate 102 that determines the exact position of each of the components in order to reposition the components at a later time as needed for subsequent tests of a wireless device model or for a wireless device of similar size, shape, and/or configuration. For example, the guides may include a magnet, RFID chip, or other reference marker that is measured or sensed by an electromagnetic sensor array within the base plate to determine and output an exact position. The test instrument or an externally connected computing device or logic element may record the positions of the components and may be utilized to automatically or manually reconfigure the test fixture 100.

As will be described in additional embodiments, the base plate 102 may be configured such that the RF antenna coupler 134 may be fixedly or temporarily attached, mounted, or embedded for testing RF characteristics of the wireless device. For example, in many cases, cell phones have a transceiver on a bottom-most left-handed portion of the wireless device. As a result, the RF antenna coupler 134 may be mounted or inserted flush or substantially flush within the base plate 102 for performing testing of the wireless device. For example, the position of the RF antenna coupler 134 may correspond to 10-G of the x-indicators 118 and y-indicators 116 when placed on the upper-right hand corner of the base plate 102. The RF antenna coupler 134 may be connected to one or more testing devices, systems, equipment, or other elements through a wired or wireless connection for measuring the RF characteristics, performance, and measurements of the wireless device.

In one embodiment, the base plate 102 may include one or more removable sections or knock outs that may allow the RF antenna coupler 134 and interconnected wires or cables to be mounted from above or below in order to perform testing of the wireless device. For example, the base plate 102 may include attachable sections in each of the quadrants of the base plate 102 as well as removable sections in the middle and along the edges of the base plate 102. The removable portions or sections may be attached to or removed from the base plate 102 based on size and shape of the RF antenna coupler 134 to ensure a snug fit, or may be attached utilizing the set screws 110 or other similar attachment mechanisms, such as tabs, clips, adhesives, locks, Velcro, biased elements, and clamps. As a result, the RF antenna coupler 134 may be mounted in the middle of the base plate 102 and the guides moved to secure the wireless device for testing without utilizing the horizontal guide 128 vertical guides 124, and back plate 132.

In one embodiment, the right guide 108 is fixably attached to the base plate 102 as a permanently fixed guide. Alternatively, the right guide 108 may be similarly moved or positioned on the base plate 102 to abut and secure the wireless device. The right guide 108 may also be narrow enough or configured to allow the vertical guides 124 to be slidably moved up and down the length of the base plate 102 based on the wireless device being tested. In one embodiment, the guides may be interchangeable and of varying sizes to secure various types of wireless devices. For example, three of the guides may be longer with a fourth guide being shorter to accommodate almost any size wireless device. A lip of the guides may allow a portion of the guide to be positioned over or below an edge portion of the wireless device. The lip may be used for stability (when mounted from above) or to ensure the proper air gap (such as 5 mm) for testing when nesting the wireless device in the guides or a mold.

In one embodiment, the vertical support 120 may be attached to the right guide 108 or the base plate 102. The vertical support 120 is a guide configured to secure or support a vertically extending portion of the wireless device that extends in the z-direction out of the horizontal plane (perpendicularly or at an angle). The vertical support 120 may be secured to the right guide 108 in order to accurately position a lid, screen, antenna, or other vertical, extending or hinged (fixed or moveable) component of the wireless device. For example, in some cases, netbooks may include an antenna that is embedded within or about the periphery of the LCD screen. As a result, LCD the screen may need to be fixedly-positioned for testing the screen at an angle that may not be 90 degrees to the base plate 102. For example, in some cases the optimal RF testing position may be at an 80 degree angle, requiring that the screen be tilted slightly. The vertical support 120 and corresponding stop 122 provides a stop for positioning the lid, screen, antenna, or other vertically extending component of the wireless device. The vertical support 120 provides an additional reference point for accurately positioning the wireless device. For example, an LCD screen may need to be positioned at an 80 degree angle to get the best RF test measurements. In some cases, wireless devices, such as a GPS unit, may be stood on one end to optimize test results. The guides and vertical support may stabilize and secure the GPS unit in a naturally unstable position during testing.

In one embodiment, the stop 122 is one of the set screws 110. In another embodiment, the stop 122 may be a padded dowel utilized to prevent scratching of the screen or other damage. The stop 122 may alternatively be a clip that passes through the vertical support 120 to secure the lid or screen of the wireless device. The vertical support 120 may be a permanent portion of the right guide 108 or may be similarly attached as needed. In another embodiment, other vertical supports may be positioned on the left guide 104 or directly on the base plate 102 in order to support a vertically extending portion or other structure of the wireless device or to ensure the screen positioning of the wireless device is consistent across multiple tests.

The vertical guides 124, horizontal guide 128 and back plate 132 provide a way of positioning the RF antenna coupler 134. The vertical guides 124 are extensions utilized for positioning the RF antenna coupler 134. The vertical guides 124 represent a vertical plane perpendicular to the horizontal plane of the base plate 102 or a z-direction of the horizontal plane. The back plate 132 is a connector for connecting the RF antenna coupler 134 to the horizontal guide 128 or other component of the test fixture 100 for RF testing. The back plate 132 when attached to the RF antenna coupler 134 may be moved in the x and y direction (as well as z-direction in various embodiments) of the vertical plane for properly positioning the RF antenna coupler 134 in an optimal position next to the antenna or communications component of the wireless device for testing the RF characteristics of the wireless device.

In one embodiment, the vertical guides 124 may be fixably mounted to the base plate 102. In another embodiment, the vertical guides 124 may be slidably mounted along the y-direction of the horizontal plane for ensuring that a proper air gap occurs between the transceiver of the wireless device and the RF antenna coupler 134. Even slight deviations in the distance between the wireless device and the RF antenna coupler 134 may affect measurements of the RF characteristics and performance. The test fixture 100 is particularly useful for ensuring the proper air gap between the wireless device and RF antenna coupler 134. The vertical guides 124, horizontal guide 128, back plate 132, and the RF antenna coupler 134 provide an effective way of bringing the RF antenna coupler 134 near a test site for measuring RF characteristics of the wireless device.

In one embodiment the grooves 126 allow the horizontal guide 128 to be raised and lowered in the y-direction of the vertical plane. As shown, the horizontal guide 128 may be a single element defining the slot 130 that allows the RF antenna coupler 134 and interconnected back plate 132 to be positioned along the length of the slot 130. As a result, the horizontal guide 128 may be moved up and down in the y-direction of the vertical plane to vertically position the RF antenna coupler 134. Similarly, the back plate 132 and corresponding RF antenna coupler 134 may be slidably or moveably-positioned or attached to the horizontal guide 128. For example the horizontal guide 128 may similarly include grooves that allow the back plate 132 or RF antenna coupler 134 to be slidably-positioned along the length of the horizontal guide 128. As shown, the horizontal guide 128 may include protruding edges configured to slidably fit within the grooves 126 for positioning the horizontal guide 128. The back plate 132 or RF antenna coupler 134 may similarly include protrusions or molded edges that may be utilized in the grooves of the slot 130. The horizontal guide 128 and the back plate 132 may also be set or positioned utilizing the set screws 110 or other connectors.

In one embodiment, the x-indicators 136 represent the Greek symbols for the alphabet including Alpha, Beta, Gamma, etc. The x-indicators 136 may similarly include levels of granularity as previously discussed. The y-indicators 138 may correspond to Roman numerals. The y-indicators 138 may be written, inscribed, molded, etched, or otherwise displayed on the vertical guides 124 ensuring that the RF antenna coupler 134 is completely horizontal or positioned as desired. As previously described, the x-indicators 136 and y-indicators 138 may include an electronic display, such as an LCD readout that indicates the exact position of the horizontal guide 128, RF antenna coupler 134, or back plate 132. The indicators or applicable markings may also be written down by a user or electronically communicated to an interconnected device for reconfiguring the test fixture 100 for subsequent tests.

In one embodiment, the horizontal guide 128 may be attachable to the vertical guides 124 at one point on each end. A plastic rod may pivotally secure the horizontal guide 128 to the vertical guides 124. As a result, the horizontal guide may be pivoted or rotationally mounted for testing the wireless device. For example, during testing where the LCD screen is positioned at a 70 degree angle and is positioned against the stop 122 the vertical guides 124 may be slid slightly toward the front guide 106 and the horizontal guide 128 may be rotated and fixably attached to the vertical guides 124 to mimic the angle of the LCD screen. In some instances, the antenna or transceiver of the wireless device may be positioned at or along some portion of the LCD screen, such that the angle of the screen may impact RF testing. In some cases, it may be important to ensure that the RF antenna coupler 134 matches the angle of the LCD screen.

Alternatively, any number of angular positions may be utilized to maximize testing effectiveness. As a result, the RF testing may ensure that optimal transmission angles are utilized to best test the RF characterizes of the wireless device. In another embodiment, RF testing may occur only within the vertical plane with fixedly attached vertical guides. As further described below, the RF antenna coupler 134, back plate 132, or a portion of the horizontal guide 128 may be rotationally or pivotally mounted to the vertical guides 124. A single vertical guide may also secure the horizontal guide 128 in a T or cross shape (or other configuration) for positioning the back plate 132 and RF antenna coupler 134.

Figure 2:
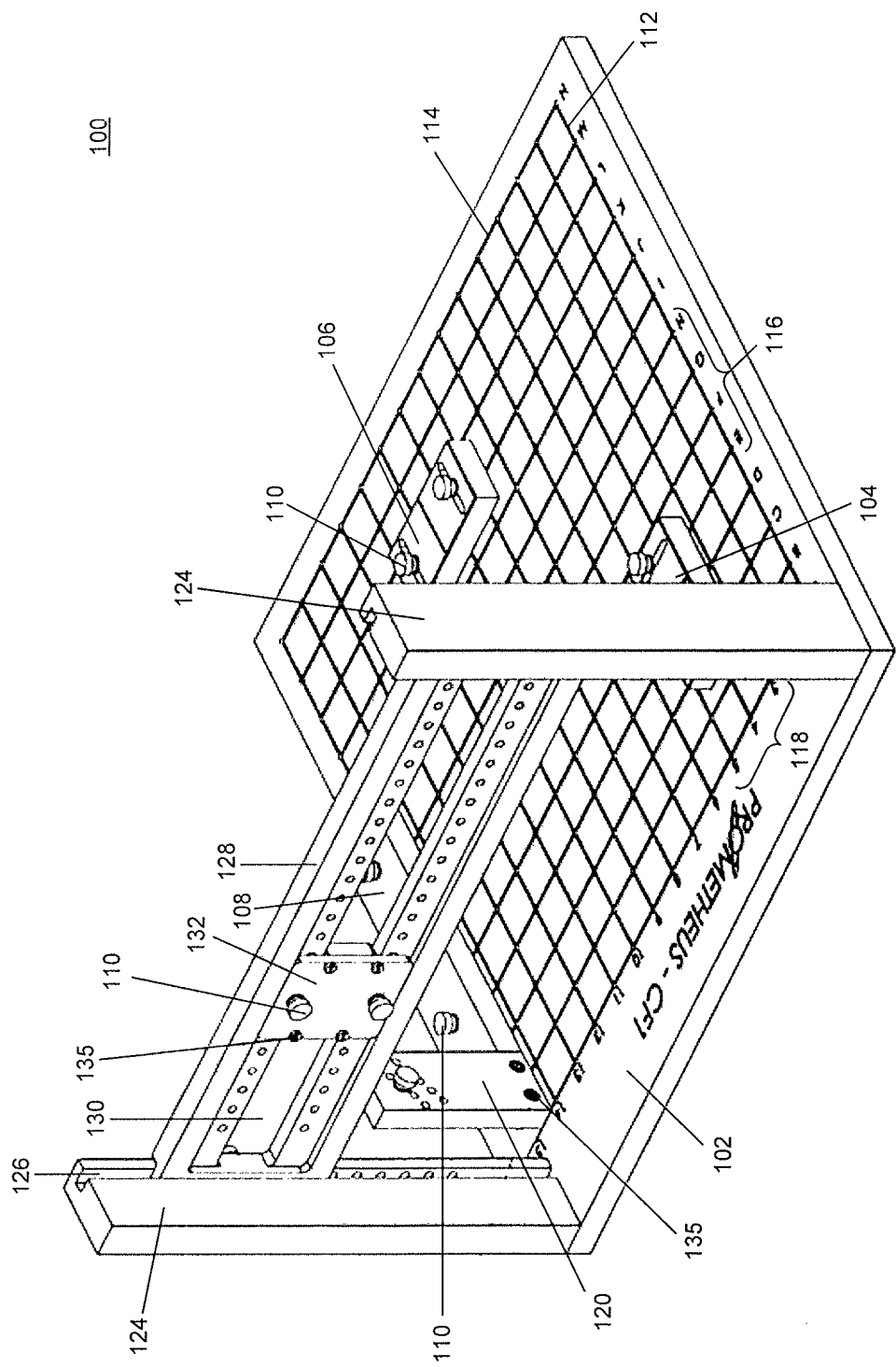
FIG. 2 is a pictorial representation of a test fixture from behind in accordance with an illustrative embodiment.

FIG. 2 is a pictorial representation of a test fixture from behind in accordance with an illustrative embodiment. FIG. 2 further illustrates the test fixture 100 from behind the vertical guides 124. In particular, FIG. 2 illustrates mounting screws 135 that may be utilized to attach the back plate 132 to the RF antenna coupler 134 and the vertical support 120 connected to the right guide 108 or alternatively to the base plate 102. The mounting screws 135 may be a smaller implementation of the set screws 110 or other similar connectors.

FIG. 2 further illustrates how the set screws 110 may be utilized to connect the back plate 132 to the horizontal guide 128. The horizontal guide 128 may include any number of through holes or ports separated by known distances for attaching the back plate 132 to the horizontal guide 128. As is shown, the size of the slot 130 may correspond to a width of the RF antenna coupler 134. The size of the slot 130 and configuration of the horizontal guide 128 may vary based on horizontal or vertical positioning of the RF antenna coupler 134. For example, the arms that make up the horizontal guide 128 may be further separated for positioning the RF antenna coupler 134 vertically rather than horizontally.

In other embodiments, the horizontal guide 128 may be a single component (without the slot 130) for fixably attaching the back plate 132 and RF antenna coupler 134. Alternatively, the arms of the horizontal guide 128 may be separate elements that allow the slot 130 size to be increased or decreased corresponding to the size of the RF antenna coupler 134 or positioning. FIG. 2 further illustrates the stop 122 that may be utilized on one or more sides of the lid or screen to position the wireless device. As shown in FIGS. 1 and 2 the guides as well as the back plate 132 may include a slot or hole that the set screws 110 pass through in order to secure the different elements to the test fixture 100. The slots may provide additional leeway allowing the guides and back plate 132 to be positioned and secured. The slots may be particularly useful for odd-shaped wireless devices that may not align well with the vertical gridlines 112 and horizontal gridlines 114 providing the test fixture 100 added adaptability.

Figure 3:
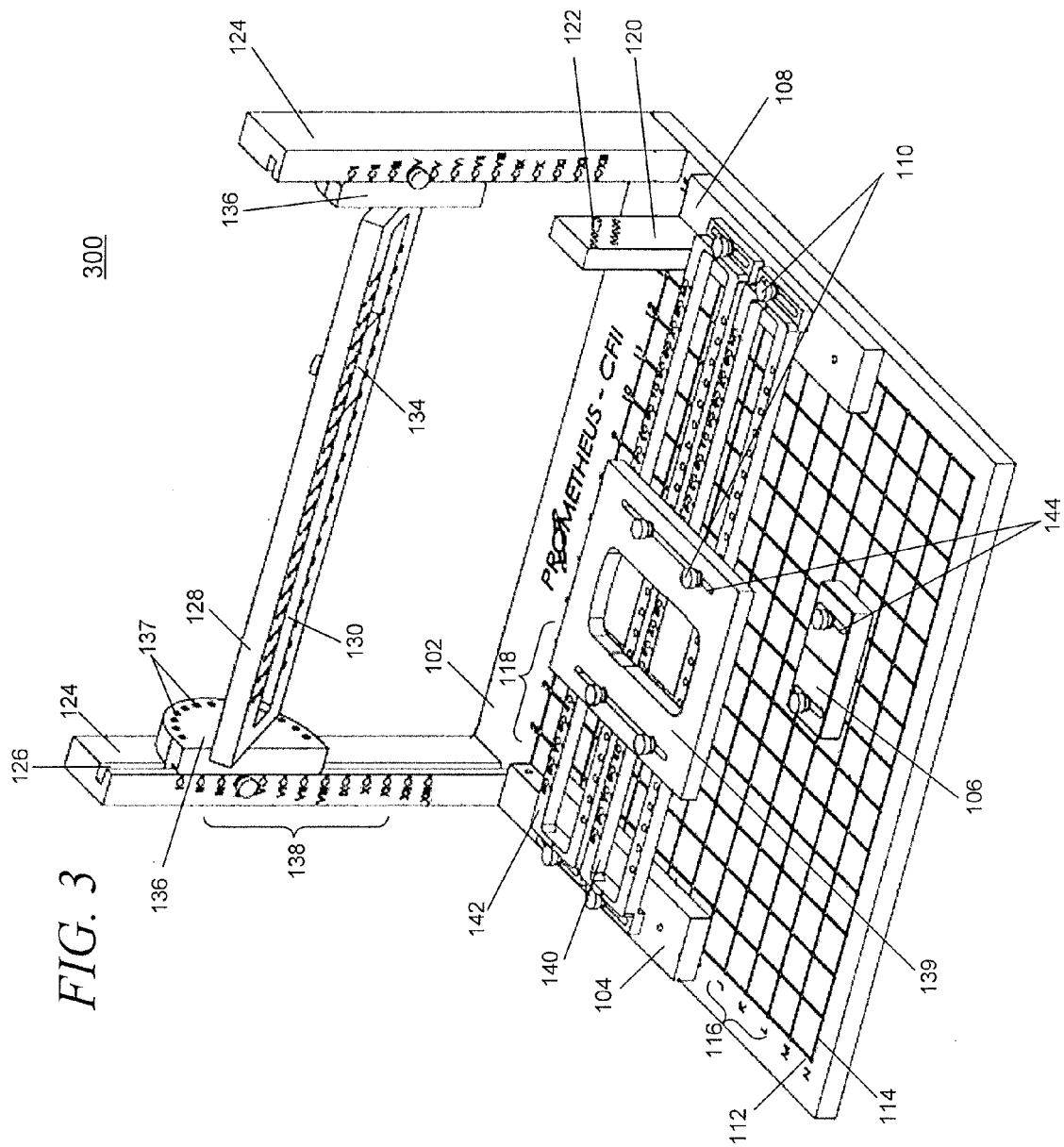
FIG. 3 is a pictorial representation of a test fixture in accordance with an illustrative embodiment.

FIG. 3 is a pictorial representation of a test fixture in accordance with an illustrative embodiment. FIG. 3 illustrates an alternative embodiment of a test fixture 300. The test fixture 300 may include various elements and components that may enable various configurations of testing to be performed on distinct types of wireless devices. The test fixture 300 describes many of the components of the test fixture 100 of FIG. 1. Those references are similarly utilized with regard to the test fixture 300 of FIG. 3.

In addition, the test fixture 300 may include radial guides 136, radial stops 137, a mold 139, horizontal guides 140 and 142, and slots 144. The radial guides 136 are a support member for rotationally or pivotally supporting the horizontal guide 128. As shown, the radial guides 136 may be slidably mounted to the vertical guides 124. The set screws 110 may similarly allow the radial guides 136 to be positioned in a y-direction of the vertical plane. The y-indicators 138 may indicate the exact positioning of the radial guide 136 to ensure that the horizontal guide 128 is level during testing. As previously described, the grooves 126 may allow the radial guides 136 to be slidably positioned.

In other embodiments, the grooves 126 may be replaced by other securing or movement mechanisms, such as belts, bearings, ladders, pins, or so forth. The horizontal guide 128 may be secured to the radial guides 136 utilizing extensions, dowels, rods or other elements that may be connected to the horizontal guide 128 at either end or that may pass through the horizontal guide 128. Any number of fasteners or securing mechanisms or features may be utilized to rotationally position the horizontal guide 128 with reference to the radial guides 136. The radial stops 137 are stops or position elements that secure the horizontal guide 128 at a fixed location or angular displacement. For example, the radial stops 137 may represent biased pins that may allow the user to angularly position the horizontal guide 128 by pressing and releasing the radial stops 137 to both move, and then subsequently fix, the horizontal guide 128 in place. The radial stops 137 may alternatively be ports or holes through which the set screws 110 or other connectors may be positioned to fix the horizontal guide 128 in place.

As a result, the horizontal guide 128 and corresponding RF antenna coupler 134 and back plate 132 may be angularly positioned for optimizing RF testing across wireless device types. The pivotally mounted horizontal guide 128 may be especially useful when testing laptops, netbooks, or other elements that may include a lid, flip-up screen, antenna or other vertically extending portion that incorporates an antenna, RF transceiver, or other communications element. Adjusting the angle of the horizontal guide 128 may reduce or increase the relative distance (i.e. air gap), angle, and orientation between the RF antenna coupler 134 associated with the test instrument and the wireless device being tested. The horizontal guide 128 may be positioned to optimize the RF characteristics measured or tested.

In one embodiment, the vertical guides 124 may be slidably mounted to the outer edge of the base plate 102 (movement in the y-direction of the horizontal plane). As a result, the vertical guides 124 and correspondingly the RF antenna coupler 134 may be positioned anywhere along the length of the base plate 102 in the x, y and z axis of the horizontal plane. Additionally, such a configuration may allow the vertical guides 124 to be moved past the left guide 104 and right guide 108 without repositioning the guides or disassembling the test fixture 300. A combination of the described embodiments may be utilized to measure RF characteristics at multiple locations above, below, adjacent, or proximate the wireless device.

The horizontal guides 140 and 142 may be similar to the horizontal guide 128. For example each may define a slot and include x and y indicators as well as through holes, ports, or slots through which the set screws 110 may be placed or screwed in to secure the horizontal guides 140 and 142. Any number of RF couplers, transceivers, antennas, or communications elements may be utilized in conjunction with the horizontal guides 140 and 142 and back plates to test the wireless device. The horizontal guides 140 and 142 may allow multiple RF antenna couplers to simultaneously test communications elements of the wireless device, such as transmitters, receivers, or antennas that may be positioned in different locations of the wireless device. For example, a GPS device may include a GPS transceiver as well as a Bluetooth, cellular, and AM/FM transceiver, each of which may be tested to determine RF characteristics and wireless compliance.

In one embodiment, the horizontal guides 140 and 142 include narrower arms that allow the horizontal guides 140 and 142 to be positioned more closely together. The slots defined by the horizontal guides 140, 142 and 128 may correspond to the size of the RF antenna coupler 134 utilized for testing and the positioning of the RF antenna coupler 134 as required for testing or as determined by testing personnel or devices.

In one embodiment, RF antenna couplers are mounted to the horizontal guides 140 and 142 utilizing one or more back plates, such as the back plate 132 of FIG. 1. The wires or cables interfacing with the RF antenna couplers may pass under the horizontal guides 140 and 142 and above the base plate 102 to a location of the interconnected test instrument. The horizontal guides 140 and 142 may be moved or positioned along the lengths of the left guide 104 and the right guide 108 to correspond to an optimal position for testing the wireless device. The horizontal guides 140 and 142 may then be fixed utilizing the set screws 110 or utilizing the other methods, devices or elements herein described or known in the art. The slots 144 may provide additional leeway for connecting the guides, horizontal guides 140 and 142, and mold 139 to the respective components.

The mold 139 is a support element configured to receive a particular model of wireless device. The mold 139 allows the wireless device to be securely and stably nested during testing. For example, the mold 139 may be sized to receive a specific model of BlackBerry for performing RF testing. The mold 139 may support the entire wireless device. For example, a bottom lip on the mold may abut the bottom edge of the wireless device for testing if placed face up or may abut the top edge of the wireless device if placed face down. The mold 139 may similarly be composed of acetal. The shape of the mold 139 may be determined by outer dimensions of the wireless device. The orientation of the mold 139 may be determined by the positioning of the internal or external and optimal position of the wireless device. The mold 139 may be sized and configured to support any of the wireless devices herein described.

The horizontal guides 140 and 142 and their respective arms or supports may support the wireless device when placed in the mold 139. In one embodiment, the horizontal guides 140 and 142 include detachable arms that may be adjusted to the size of the required RF antenna coupler. The mold 139 and/or guides are preferably sized such that the wireless device is held securely or snugly during testing. The mold 139 ensures that each wireless device is uniformly secured (position and location) during testing for repeatability and subsequent reproduction of RF testing for confirmation or verification purposes. In one embodiment, the exact position and location of the mold 139 as secured to the test fixture 300 may be recorded and subsequently utilized by both an OEM and service provider to confirm RF test results. For example, a failure determined by the service provider during RF testing may be repeated by the OEM utilizing the mold 139 and indications of the exact position of the mold 139 on the test fixture. As a result, each party may exactly duplicate testing positions and results to foster collaboration, and provide venues for determining errors when problems arise. As a result time and effort are saved by multiple parties and a single test fixture may be utilized to test multiple devices.

An edge of the mold 139 may include a cut-out allowing a user to easily remove the wireless device after performing testing. Additionally, other pop-out mechanisms, such as a lever under the wireless device, may be incorporated with the mold 139 for removing the wireless device after testing.

The test fixture 300 may be compatible with any number of molds. For example, molds for GPS devices may be wider and more rectangular while molds for cell phones, such as the iPhone, will be long and narrow. As previously described, the guides and particularly the left guide 104 and the right guide 108 may be long enough to accommodate the separation of the horizontal guides 140 and 142 that may be required to perform testing of the wireless device. Alternatively, multiple guides may be placed next to each other to adapt to the current testing needs of the user. The horizontal guides 140 and 142 and the mold 139 provide an effective way of performing testing for wireless devices that previously required multiple test fixtures. As a result, one day the test fixture 300 may be utilized to test a model of netbooks, and then hours later when the tests for the netbook are done, the test fixture 300 may be configured to test a specific model of cell phones.

The molds, as well as the guides including the horizontal guides 140, 142 and 128, may be sold independently or distributed in order to mix and match parts. For example, horizontal guides that accommodate a specific size of RF antenna coupler 134 may be easily integrated and utilized with the test fixture 300, as needed. Additionally, the mold 139 may be generated for newly released wireless devices allowing full-scale RF testing to occur in a matter of days rather than weeks or months. The mold 139 and the horizontal guides 140 and 142 ensure that the proper air gap occurs between the one or more RF antenna couplers and the wireless device and corresponding antenna or communications elements. The length, width, height, shape, and size of the guides as well as the mold 139 may vary based on the wireless device being tested. For example, a wireless GPS device may be thicker and require taller guides to best secure the GPS during RF testing.

As a result, the compliance testing may be easily performed for any number of wireless devices very simply and with lower costs. The test fixture 300 may be utilized for multiple wireless devices and the time required for a user to understand the test fixture 300 and reconfigure it for wireless devices is minimal. The x-indicators 118 and y-indicators 116 on the base plate 102 as well as the horizontal guides 140, 142 and 128 may allow a user to determine the exact location or position of each element for subsequent tests. For example, a user may write down the positioning of each guide, the mold 139, multiple RF antenna couplers and other components of the test fixture 300 to easily recreate the testing configuration and positioning for consistency and repeatability.

In one embodiment, the vertical guides 124 may be slid forward so that the RF antenna coupler 134 may measure and test RF characteristics of the wireless device at the same time RF antenna couplers mounted in the horizontal guides 140 and 142 or base plate 102 perform similar measurements and tests. As previously described, any of the components of the test fixture 300 may be connected to electrical or mechanical elements for positioning and moving each element to a position or location. For example, worm gears, belts, motors, plastic chains, drives or other elements may remotely move each element to an optimal position for performing testing of the wireless device. For example, a modular drive and position mechanism may be temporarily connected to the test fixture and then subsequently removed during the full-scale RF testing to prevent unwanted interference. In another embodiment, drive elements may be shielded or encapsulated in materials preventing RF interference.

As previously described, in a self-configuration mode, the test fixture 300, wireless device, and test instrument may be configured to determine the optimal position for transmitting and receiving information to and from the wireless device and to and from the RF antenna coupler 134. In some cases, different positions may be utilized for different elements of a test, such as a transmit and a receive. For example, the wireless device may include antennas one of which is used for transmitting wireless communications and another which is utilized for receiving wireless communications. Alternatively, a single location may be used for performing all of the tests.

The test fixture 300 may be sized and configured to accommodate both full size laptops and the smallest cell phones minimizing the test fixtures and test instruments required to test across product lines, test batches, device models, or communications standards.

Figure 4:
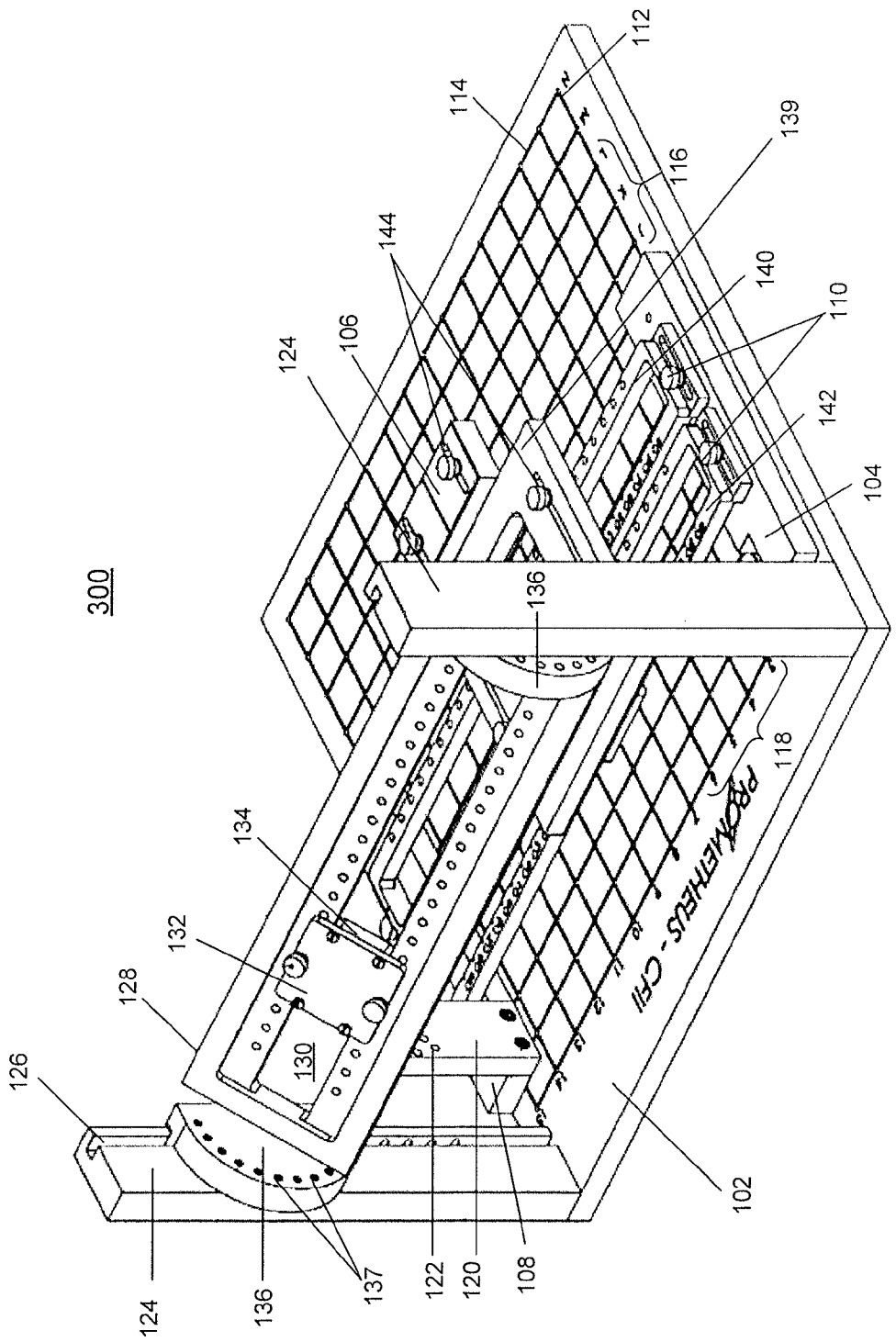
FIG. 4 is a pictorial representation of a test fixture from behind in accordance with an illustrative embodiment.

FIG. 4 is a pictorial representation of a test fixture from behind in accordance with an illustrative embodiment. FIG. 4 provides another view of the test fixture 300 and is shown for purposes of understanding the flexibility and utility of the test fixture 300.

Figure 5:
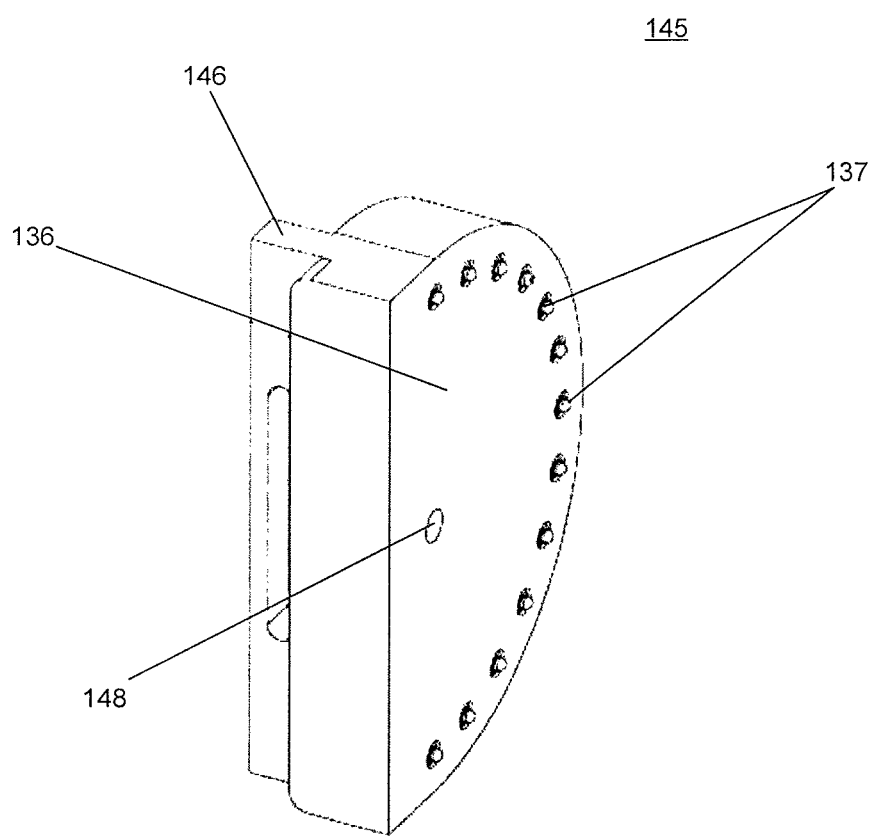
FIG. 5 is a pictorial representation of a radial guide in accordance with an illustrative embodiment.

FIG. 5 is a pictorial representation of a radial guide 145 in accordance with an illustrative embodiment. FIG. 5 illustrates a particular implementation of the radial guides 136 shown in FIG. 4. The radial guide 145 may include the radial stops 137 as well as an extension 146 and a port 148. The radial stops 137 are extensions utilized to position and secure the horizontal guide. The radial stops 137 may include locking or biased pins that may be pushed in order to slide or rotate the horizontal guide into a desired position. The port 148 is a pivot point about which the horizontal guide rotates.

In one embodiment, extensions, pins, pivots or other elements of the horizontal guides may be positioned within the port 148 in order to rotate to the desired position. The extension 146 is an extending member that allows the radial guide 145 to slide up and down along the vertical guides.

In one embodiment, the extension 146 may be shaped so that the radial guide 145 may only be inserted or removed from an uppermost portion of the groove of the vertical guide or from a bottommost portion of the vertical guide when the vertical guide is not connected to the base plate. Other grooves and extension shapes may be similarly utilized to slidably connect the components of the test fixture as previously described.

Figure 6:
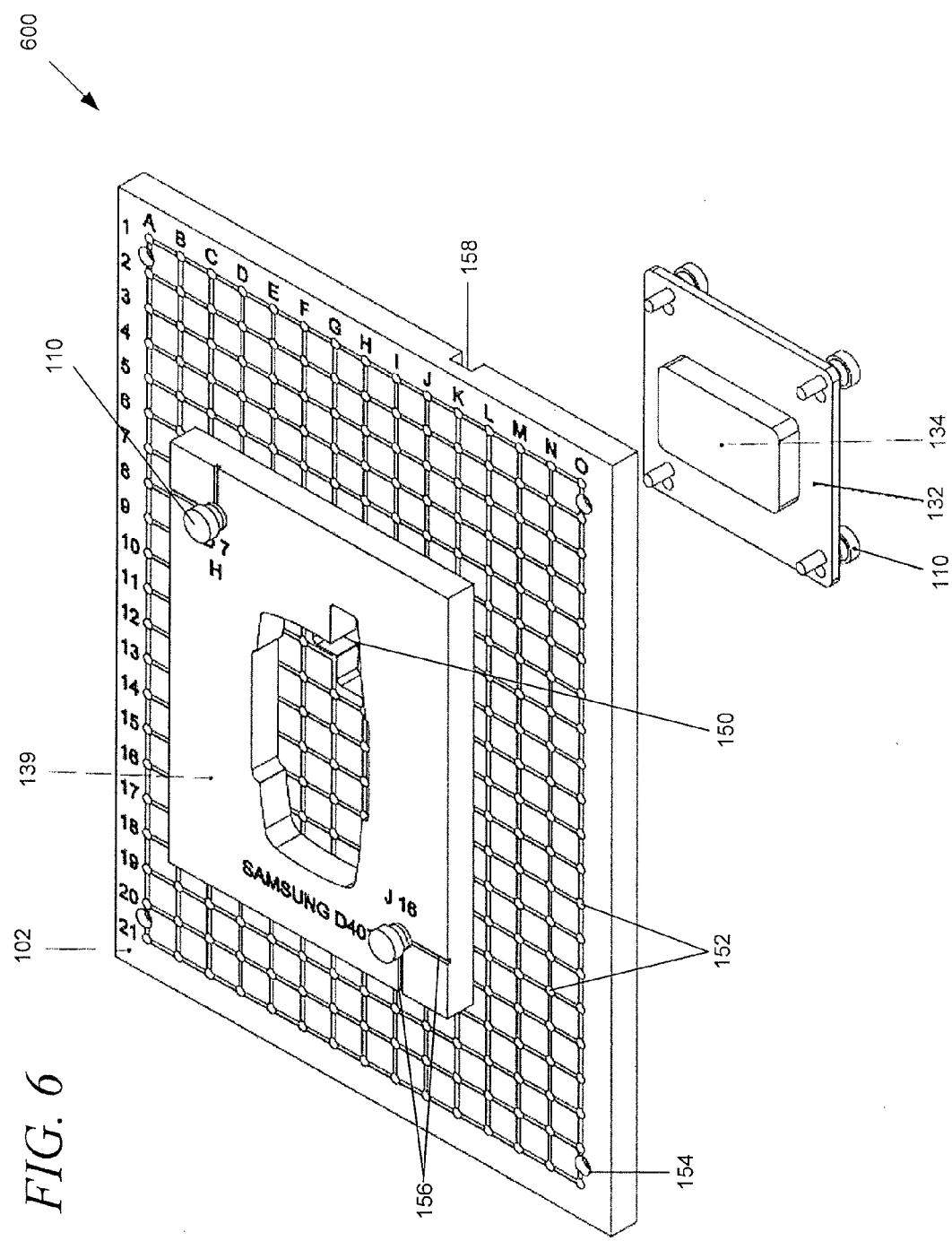
FIG. 6 is a pictorial representation of a test fixture in accordance with an illustrative embodiment.

FIG. 6 is a pictorial representation of a test fixture in accordance with an illustrative embodiment. FIG. 6 illustrates another embodiment of a test fixture 600. The test fixture 600 may be utilized to perform RF testing. In addition to the elements previously described, the test fixture 600 of FIGS. 6 and 7 may further include a cut-out 150, through holes 152, mounting through holes 154, slits 156, and cable cut-outs 158. The test fixture 600 provides a test stand for quickly and repeatably performing RF testing. The test fixture 600 may alternatively be utilized to secure the wireless device during painting, customization, assembly, repair, or other activities. The test fixture 600 is particularly useful for wireless devices that do not include a substantially vertically extending portion, but rather may be tested in the horizontal plane.

The through holes 152 are holes or ports for attaching guides, molds, or other elements to the base plate 102 utilizing any number and type of connectors. The through holes 152 are an alternative or supplement to the gridlines or grooves previously described. For example, the set screws 110 may be attached to the base plate 102 through the through holes 152. The mounting through holes 154 are through holes that allow the test fixture 100 to be mounted to a test platform, RF chamber, or other element. The mounting through holes 154 may be used with the set screws 110 or other attachment elements or connectors. The mounting through holes 154 may also be utilized to attach guides, such as the vertical guides 124 of FIG. 1, to the base plate 102.

As previously described, molds, such as mold 139, may be utilized to secure any number of device types. The mold 139 may secure the wireless device in any number of configurations, such as open, closed, positioned on a side or end, and so forth. For example, the mold 139 may secure a Samsung model flip phone that is placed in the mold 139 in an open position for testing.

The mold 139 may be moved to position the wireless device directly above the RF antenna coupler 134 positioned within the base plate 102. The mold 139 may be positioned in the optimal position for maximizing the measurements and RF characteristics measured by the RF antenna coupler 134. The slits 156 are defined within the mold 139 for positioning the wireless device in the optimal position. The mold 139 may include slits 156 in various locations of the mold and in various shapes. For example, the mold 139 may include slits that are semi circular in each quadrant of the mold 139 for securing the mold 139 to the base plate utilizing set screws 110. Multiple slits 156 provide additional leeway and may ensure that the mold 139 is securable to the base plate regardless of the position on the mold 139.

As shown in FIG. 6, the back plate 132 may be sized to secure the RF antenna coupler 134 in a desired position within the cut-out 150. The cut-out 150 is a space defined within the base plate 102. The cut-out 150 may utilize any number of shapes. For example, the cut-out 150 may be sized and shaped as further shown in FIG. 7 to accommodate the RF antenna coupler 134 in any number of positions or alignments. The cut-out may accommodate various size of RF antenna couplers that may be positioned along the x axis or y axis of the base plate 102. The cut-out 150 and back plate 132 may additionally accommodate odd or distinctly shaped RF antenna couplers. The back plate 132 may be secured to the base plate 102 utilizing the set screws or other connectors.

Figure 7:
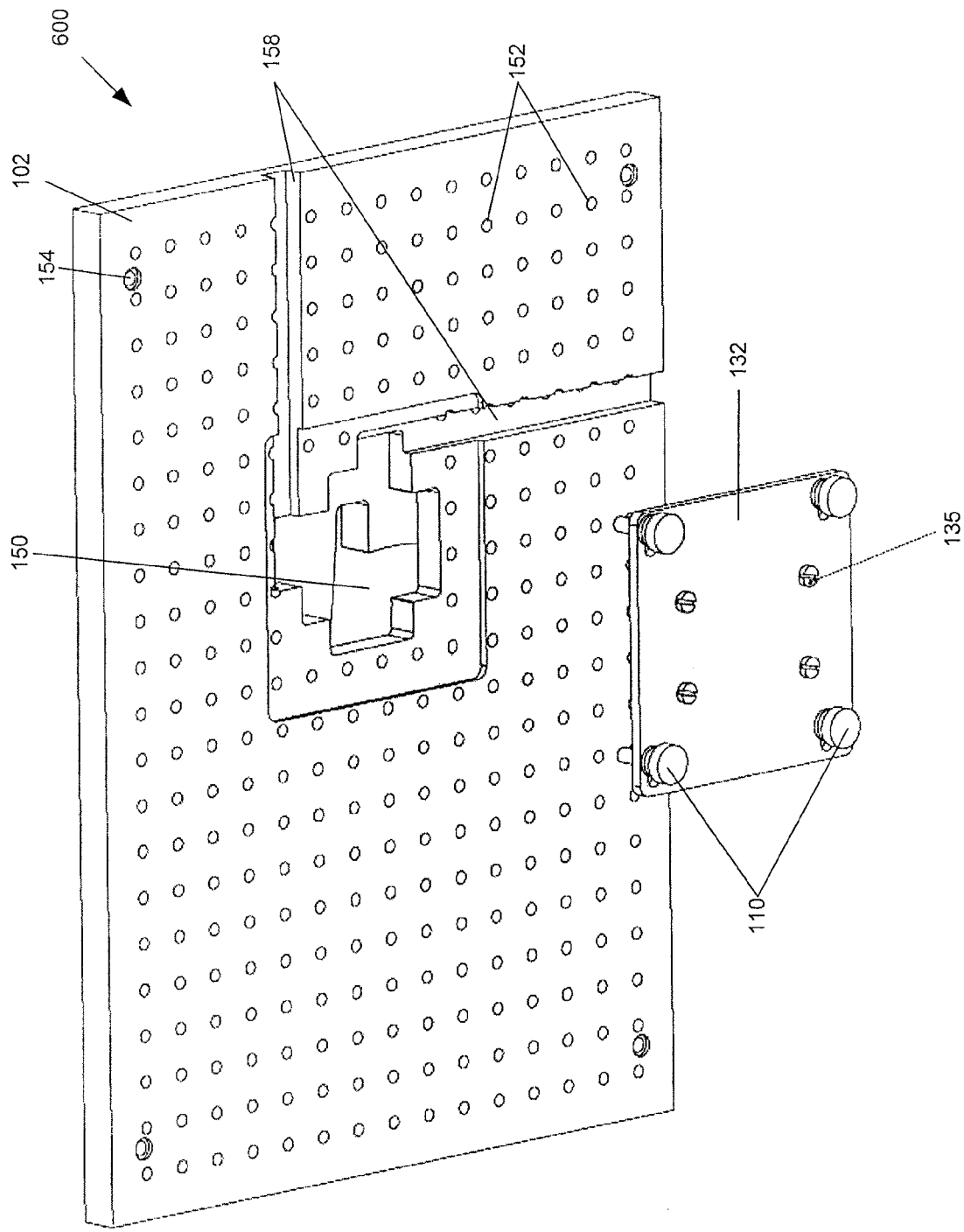
FIG. 7 is a pictorial representation of a test fixture as viewed from below in accordance with an illustrative embodiment.

FIG. 7 is a pictorial representation of a test fixture as viewed from below in accordance with an illustrative embodiment. As shown, the back plate 132 is attached to the bottom of the base plate 102. In one embodiment, the base plate 102 is recessed in an area surrounding the cut-out 150 so that the base plate 102 may sit flush on a surface during testing. For example, the back plate 132 attached to the RF antenna coupler by the mounting screws 135 may be attached to the base plate 102 through the through holes 152 utilizing the set screws 110 without unbalancing the test fixture 600. The size and shape of the recessed area of the base plate 102 may correspond to the back plate 132 and/or RF antenna coupler. In another embodiment, the RF antenna coupler may be inserted or connected directly to the base plate 102 in the cut-out 150.

The cable cut-outs 158 are a recessed portion of the base plate 102 that cover, house, or encompass the wire or cables connected to the RF antenna coupler when the test fixture 600 is in use. The cut-out 150 and the cable cut-outs 158 may be a permanent part of the base plate 102 or may include portions of the base plate 102 that are removable, as needed for specific forms of RF testing.

FIG. 8 is a flowchart of a process for performing RF testing utilizing the test fixture in accordance with an illustrative embodiment. In one embodiment, the process of FIG. 8 may be implemented by a user, such as an engineer, lab technician, or other user utilizing an RF test fixture. The process of FIG. 8 may begin by positioning a wireless device on a base plate of a test fixture (step 802). In one embodiment, the wireless device may be placed flush against one or more guides, such as a right guide. The wireless device may be a single flat component or a hinged device, such as a netbook. The wireless device may alternatively have any number of physical configurations or may be positioned face down on an edge or in any position useful for performing the RF testing.

Next, the user positions a number of guides to support edges of the wireless device (step 804). In one embodiment, the guides may be slidably moved along gridlines to a position supporting the wireless device and then further secured in the specific location. In another embodiment, the guides may be added or removed from the base plate, as needed. In yet another embodiment, a mold may be attached directly to the base plate or to one or more guides for performing the RF testing (step 802 and 804 may alternatively be integrated when the wireless device is nested in the positioned mold). The test fixture may include as many guides as are necessary to perform testing. The guides may be secured to the base plate utilizing set screws, pegs, clamps, elastomeric fixtures that attach the guides when released, or utilizing any number of other elements.

Next, the user positions an RF antenna coupler to correspond to an optimal position for testing the wireless device (step 806). The antenna coupler may be mounted or attached to on a back plate or connector. The back plate may be slidably connected to a horizontal guide, which is slidably connected to one or more vertical guides or to guides on the base plate. As a result, the RF antenna coupler or RF antenna couplers may be positioned horizontally, vertically, and rotationally in the x, y, and z-direction of the horizontal and vertical plane to perform testing. The optimal position for the RF antenna coupler may be determined utilizing trial and error, design or manufacturing information, focused implementation, or logic determinations based on RF measurements.

In another embodiment, the movement of the guides and RF antenna coupler may be controlled by one or more electronic, hydraulic, or mechanical elements. For example, worm gears, belts, knobs, hydraulics, pneumatics, motors, or other suitable components may position the guides and/or the RF antenna coupler. In one embodiment, all electrical components are shielded or positioned outside the hood to reduce RF and mechanical interference. For example, plastic drive ports may allow a motor with interconnected logic to determine the positions of components of the test fixture for subsequent tests of similar devices. Similarly, the drive ports may be moved by motors connected to a computer or logical device configured to move the guides or mold to optimal positions or locations for performing the RF testing. The guides may be moved manually or based on an automatic configuration or securing mode selectable for the test fixture. For example, exact coordinates for each component may be saved for automatically reconfiguring the test fixture to test a specified wireless device or model.

The logic and other components for controlling the test fixture may be integrated with the test fixture or externally connected to the test fixture so that the configuration of the test fixture may occur without the influence of metallic or electronic components that may effect RF testing. In one embodiment, the RF antenna coupler may be automatically positioned utilizing computerized motors that execute software or hardware optimization logic for testing the wireless device under ideal or acceptable circumstances or characteristics. For example, external logic may determine the optimal position that utilizes the ideal air gap, optimal angle for the RF antenna coupler to measure transmissions, and the optimal RF antenna coupler location for sending packets, data, information, or communications to and from the wireless device, as further described below.

Next, the user identifies a location of the guides, wireless device, and/or RF antenna coupler(s) (step 808). The position or location of the different elements may be performed by reading, analyzing, or evaluating markings on the base plate, vertical guides, horizontal guide, and other components. For example, the user may write down the coordinates of each element of the test fixture. The user may also mark locations or positions of individual set screws. In another embodiment, the location of the different components may be electronically determined and indicated by a display or by communication to a separate communications or computing device.

Next, the user performs testing of the wireless device utilizing test instruments connected to the RF antenna coupler (step 810). Any number of tests may be performed for the wireless device. Subsequently, the wireless device may be removed from the test fixture and another similar device (i.e. device of the same model) may be tested to determine an average performance for a number of wireless devices. Alternatively, the test fixture may be reconfigured for testing other wireless devices, as needed.

In another embodiment, the RF antenna coupler 134 may be embedded within the base plate of the test fixture. A configuration with the RF antenna coupler embedded or temporarily positioned within the base plate may allow devices, such as some models of cell phones, personal digital assistants, tablets, electronic readers, or other devices to be tested without using the RF antenna coupler supported by the vertical guides. The RF antenna coupler may be fixably attached to the base plate or may be positioned within a number of pre-configured locations of the base plate to optimize testing and to accommodate the size, shape, RF characteristics, and antenna configuration of the wireless device. As previously described, the RF antenna coupler may be utilized with other guides in a stacked configuration Transmitter Tests During a transmitter test, a RF cable may be connected between the RF IN/OUT port of the test instrument to the RF port on the wireless device being tested. The insertion loss values for the RF cable may be set for the uplink channels (i.e. low, mid and high channels) on the test instrument. Next, the test instrument may be configured to allow the device to register, including, for example, configuring the uplink and downlink channels, and the channel configurations.

The RF power level of the test instrument may be set based on the appropriate wireless standard for maximum transmit output power measurements. Next, a call or communication may be initiated from the wireless device. The test instrument measures and records the maximum transmit output power for the specified level and configuration. The maximum transmit output power may be used as a baseline transmission measurement. Portions of the transmitter test may then be repeated as necessary for mid channel, high channels, and other bands.

Optimal Position

In addition to the process described above, the following steps may also be performed. The x, y, and angular positions of the RF antenna coupler, back plate, guides, and set screws or connectors, may be noted or recorded for each of the following steps for iteratively determining an optimal or acceptable position or "sweet spot" for performing a number of RF tests. The back plate and connected RF antenna coupler may be positioned near the upper left hand portion of the wireless device, including the device lid, keyboard, or other portion of the wireless device. A maximum transmission output power reading may be taken and recorded.

Next, the back plate and RF antenna coupler may be moved one or more measurements to the right, such as one centimeter or millimeter to the right. Measurements are performed each time the back plate and RF antenna coupler are moved until the back plate and RF antenna coupler are at the right hand corner of a portion of the wireless device. Next, the back plate and RF antenna coupler are moved back to the left most portion of the wireless device and lowered one measurement unit before returning to taking measurements and moving the back plate and RF antenna coupler. This process may be performed until the maximum transmit output power reading has degraded 10 dB from a maximum reading. The position that corresponds to the highest maximum transmit output power reading is marked as the initial optimal position. The test fixture as described may allow the position optimization to be performed once and then repeated for multiple devices utilizing the indicators, molds, guides, stops, set screws, and other elements of the test fixture.

In another embodiment, measurements may taken at spaced (one on each side before moving down) or random locations to determine the optimal location or position. For example, a similar process of moving and taking measurements may be utilized including triangulation, interpolation, estimation, inference, design and historical information, random sampling or other automated techniques. The determination of the optimal location may be implemented by logic or an algorithm configured to optimize the RF characteristics of the wireless device measured during RF testing. As a result, the ideal position of the wireless device relative to the RF antenna coupler(s) is performed and may be subsequently reused for testing similar wireless devices.

In one embodiment, the process may be performed electronically utilizing a test instrument, digital logic, a database storing RF measurements in matrix form, step motors, or other elements that may be externally or internally connected to gears, drive ports, or belts of the test fixture. As a result, the optimal position of the RF antenna coupler may be more accurately determined without utilizing a manual process. The RF chamber may be closed and the movement elements may be turned off between performing tests and measurements at each position or location to prevent RF interference.

The process for determining the optimal position may similarly be performed for horizontal guides, connectors, a mold (or other custom fixture) and RF antenna couplers that are connected to the base plate. In addition, the locations of the mold, wireless device, and set screws may be noted or recorded. Linking or associating the optimal measurements with the position of the components may be performed electronically or manually.

In one alternative embodiment, the RF antenna coupler is embedded within the base plate. As a result the entire mold may be moved between positions to determine the optimal positioning and air gap of the wireless device relevant to the fixed RF antenna coupler for performing testing.

The optimal position as determined may also be utilized for the receiver test described below. In some cases, transmitting and receiving components of the wireless device may be positioned separately requiring multiple determinations of the optimal location for the corresponding type of RF communication.

Receiver Test

In one embodiment, receiver tests may be performed after the transmitter tests once the RF cable has already been connected. The insertion loss values for the RF cable may be set for the downlink channels (i.e. low, mid and high channels) on the test instrument. The test may be configured to measure BER. Next, the BER is measured. In some cases, during BER/FER measurements for the appropriate wireless standard, the RF power level for the test instrument is decreased until the BER/FER limits are reached. As an example, the WCDMA BER limit is 0.1% with an RF power level set to −104 dBm. The RF power level may be decreased from a starting RF power level of −104 dBm decrement in 1 dB intervals until a BER reading of 0.1% is achieved. The RF power level is recorded and may be associated with the BER and FER measurements for the wireless device. Next, steps of the receiving measurements may be performed for mid-channel and high channels and other bands as necessary.

The illustrative embodiments may allow the test fixture to be utilized to test a number of wireless devices. In particular, the RF antenna coupler may be ideally-positioned in the optimal x, y, and z-direction and location. As a result, a new test fixture does not need to be purchased or custom made for each new wireless device. In particular, the guides, mold and/or the RF antenna coupler may be positioned and a new device may be tested. Additionally, the test fixture may be reconfigured according to indicators or other information for retesting a wireless device or a similar make or model. Any of the embodiments, features, methods, and components herein described may be combined or otherwise utilized to perform RF testing or to secure a wireless device for any reasons.

The previous detailed description is of a small number of embodiments for implementing the invention and is not intended to be limiting in scope. The following claims set forth a number of the embodiments of the invention disclosed with greater particularity.

What is claimed:

1. A method for testing radio frequency (RF) characteristics of a wireless device, the method comprising:
   positioning the wireless device in an x-position and a y-position of a horizontal plane of a test fixture;
   positioning a vertically extending portion of the wireless device against a vertical support of the test fixture;
   positioning an RF antenna coupler in an x-position and a y-position of a vertical plane, the positioning of the wireless device and the RF antenna coupler corresponding to acceptable RF characteristics for testing the wireless device;
   positioning a plurality of guides on a base plate for securing the wireless device, the plurality of guides including a right guide, a left guide, and a front guide, and wherein the plurality of guides abut against edges of the wireless device;
   positioning a back plate securing the RF antenna coupler for measuring the RF characteristics of the wireless device; and
   identifying positions of the wireless device and the RF antenna coupler, wherein the identified positions are utilized to perform subsequent testing of similar wireless devices.

2. The method according to claim 1, further comprising:
   securing the plurality of guides, the back plate, and the vertical support in respective positions.

3. The method according to claim 2, further comprising:
   performing RF testing to determine the RF characteristics of the wireless device, wherein the positions correspond to an optimal air gap and positioning of the RF antenna coupler relative to the wireless device.

4. The method according to claim 1, wherein the identifying positions is performed electronically by sensing positions of components of the test fixture and displaying the positions to a user.

5. The method according to claim 2, further comprising:
   securing the plurality of guides and the vertical support utilizing connectors.

6. The method according to claim 1, wherein the back plate is slidably connected to a horizontal guide, the back plate being operable to be positioned in an x-direction of the vertical plane, the horizontal guide being slidably and pivotally connected between vertical guides, the horizontal guide operable to be positioned in a y-direction of the vertical plane.

7. The method according to claim 1, wherein the identifying is performed utilizing marks on the test fixture.

8. The method according to claim 6, further comprising:
   indicating an x-position and a y-position in the horizontal plane for each of the plurality of guides, a position for a vertical support, a y-position of the horizontal guide in the vertical plane, a radial position of the horizontal guide, and an x-position of a back plate in the vertical plane for subsequently tests of the similar wireless devices.

9. The method according to claim 8, further comprising:
   positioning a second RF antenna coupler in the base plate for simultaneous testing of the wireless device, wherein an electronic display indicates the positions.

10. The method according to claim 1, wherein the securing is performed utilizing set screws through the plurality of guides, the vertical support, a horizontal guide, and the back plate.

11. The method according to claim 1, further comprising:
    automatically determining the positions for positioning the RF antenna coupler for the testing; and
    automatically repositioning the test fixture to the positions in response to a user selection to perform testing for a similar wireless device.

12. A method for testing RF characteristics of a wireless device comprising:
    positioning the wireless device on a base plate of a test fixture;
    positioning a vertically extending portion of the wireless device against a vertical support of the test fixture;
    positioning an RF antenna coupler above the wireless device; and
    identifying positions of the wireless device and the RF antenna coupler, wherein the identified positions are utilized to perform subsequent testing of similar wireless devices.

13. The method according to claim 12, further comprising:
    performing RF testing of the wireless device to determine the RF characteristics of the wireless device, wherein the positions correspond to an optimal air gap of the RF antenna coupler relative to the wireless device.

14. The method according to claim 12, further comprising:
    positioning a second RF antenna coupler in the base plate for further testing the RF characteristics of the wireless device.

15. The method according to claim 12, wherein the RF characteristics are determined utilizing transmitter measurements, modulation measurements, spectrum measurements, and receiver measurements.

16. The method according to claim 12, wherein the RF characteristics are tested by one or more testing instruments in communication with the RF antenna coupler.

17. A method for testing wireless characteristics of a wireless device comprising:
    receiving the wireless device on a base plate of a test fixture;
    positioning a vertically extending portion of the wireless device against a vertical support of the test fixture;
    securing an RF antenna coupler above the wireless device; and indicating positions of the wireless device and the RF antenna coupler, wherein the indicated positions are utilized to perform subsequent testing of similar wireless devices.

18. The method according to claim 17, further comprising:
automatically determining the positions of the wireless device and the RF antenna coupler for the testing; and
automatically repositioning the test fixture to the positions in response to a user selection to perform testing for the similar wireless devices.

19. The method according to claim 17, wherein the wireless device is secured by one or more guides.

20. The method according to claim 17, wherein the wireless characteristics are determined utilizing transmitter measurements, modulation measurements, spectrum measurements, and receiver measurements.

21. The method according to claim 17, wherein the wireless characteristics are tested by one or more testing instruments in communication with the RF antenna coupler.

* * * * *